(12) United States Patent
Cai et al.

(10) Patent No.: US 11,646,346 B2
(45) Date of Patent: May 9, 2023

(54) CONTACT STRUCTURE WITH AIR SPACER FOR SEMICONDUCTOR DEVICE AND METHOD FOR FORMING THE SAME

(71) Applicant: Taiwan Semiconductor Manufacturing Company, Ltd., Hsinchu (TW)

(72) Inventors: Chung-Hao Cai, Hsinchu (TW); Chun-Po Chang, Pingtung (TW); Chien-Yuan Chen, Taichung (TW); Yen-Jun Huang, Hsinchu (TW); Ting Fang, Kaohsiung (TW); Chen-Ming Lee, Yangmei (TW); Fu-Kai Yang, Hsinchu (TW); Mei-Yun Wang, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 23 days.

(21) Appl. No.: 17/225,324

(22) Filed: Apr. 8, 2021

(65) Prior Publication Data
US 2022/0328622 A1 Oct. 13, 2022

(51) Int. Cl.
*H01L 29/06* (2006.01)
*H01L 21/8234* (2006.01)
(Continued)

(52) U.S. Cl.
CPC .. *H01L 29/0653* (2013.01); *H01L 21/823418* (2013.01); *H01L 21/823468* (2013.01); *H01L 21/823481* (2013.01); *H01L 29/6656* (2013.01)

(58) Field of Classification Search
CPC ............................ H01L 29/0843–0891; H01L 29/66636–66643; H01L 21/823418–823425; H01L 29/66575–66598; H01L 29/66515; H01L 29/41725–41791; H01L 29/7839; H01L 29/806; H01L 29/665–66507;
(Continued)

(56) References Cited

U.S. PATENT DOCUMENTS

| | | | |
|---|---|---|---|
| 8,772,109 | B2 | 7/2014 | Colinge |
| 8,785,285 | B2 | 7/2014 | Tsai et al. |

(Continued)

*Primary Examiner* — Sonya McCall-Shepard
(74) *Attorney, Agent, or Firm* — Birch, Stewart, Kolasch & Birch, LLP

(57) ABSTRACT

A method of forming a semiconductor device structure is provided. The method includes forming an insulating layer over a semiconductor substrate including a conductive feature, forming an insulating layer with a trench over the semiconductor substrate to expose the conductive feature, and forming a sacrificial liner layer over two opposite sidewalls and a bottom of the trench. Ions are implanted into the conductive feature covered by the sacrificial liner layer, so that a doping region is formed in the conductive feature and has two opposite side edges respectively separated from the two opposite sidewalls of the trench. The sacrificial liner layer is removed after forming the doping region, and a conductive connecting structure is formed in the trench. The two opposite sidewalls of the conductive connecting structure are respectively separated from the two corresponding opposite sidewalls of the trench by an air spacer.

20 Claims, 13 Drawing Sheets

(51) Int. Cl.
  *H01L 29/66* (2006.01)
  *H01L 21/265* (2006.01)
  *H01L 21/768* (2006.01)
  *H01L 21/8238* (2006.01)
  *H01L 27/092* (2006.01)

(58) Field of Classification Search
  CPC ......... H01L 29/7845; H01L 2029/7858; H01L 29/6653; H01L 29/66553; H01L 29/6656; H01L 21/28132–2815; H01L 21/823468; H01L 21/823864; H01L 29/66689; H01L 29/66719; H01L 29/4983; H01L 29/51–518; H01L 21/823481; H01L 29/0649–0653; H01L 29/4991; H01L 21/823431; H01L 21/823821; H01L 21/845; H01L 29/66795–66818; H01L 29/41791; H01L 29/785–786; H01L 2029/7857–7858; H01L 27/0886; H01L 27/0924; H01L 27/10826; H01L 27/10879; H01L 27/1211; H01L 29/0653; H01L 21/0415; H01L 21/046–047; H01L 21/2253; H01L 21/265–266; H01L 21/3115–31155; H01L 21/3215–32155; H01L 21/425–426; H01L 21/76825; H01L 21/76859; H01L 21/76862; H01L 29/36–365; H01L 29/515; H01L 21/76805; H01L 29/41766; H01L 21/76897; H01L 21/76834; H01L 29/0847; H01L 29/78; H01L 29/7851
  See application file for complete search history.

(56) References Cited

U.S. PATENT DOCUMENTS

| | | | |
|---|---|---|---|
| 8,816,444 | B2 | 8/2014 | Wann et al. |
| 8,823,065 | B2 | 8/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |
| 9,520,482 | B1 | 12/2016 | Chang et al. |
| 9,576,814 | B2 | 2/2017 | Wu et al. |
| 10,283,600 | B2 * | 5/2019 | Lee ................. H01L 21/823431 |
| 10,971,408 | B2 * | 4/2021 | Yeong ................. H01L 21/7682 |
| 2020/0381516 | A1 * | 12/2020 | Zhaomeng ........ H01L 21/76897 |

* cited by examiner

CONTACT STRUCTURE WITH AIR SPACER FOR SEMICONDUCTOR DEVICE AND METHOD FOR FORMING THE SAME

BACKGROUND

The semiconductor integrated circuit (IC) industry has experienced rapid growth. Technological advances in IC materials and design have produced generations of ICs where each generation has smaller and more complex circuits than the previous generation. Advances in semiconductor manufacturing processes have resulted in semiconductor devices with finer features and/or higher degrees of integration.

As the semiconductor industry has progressed into nanometer technology process nodes in pursuit of higher device density, challenges from both fabrication and design issues have resulted in the development of three-dimensional designs, such as the fin field effect transistor (FinFET) that is fabricated with a thin vertical "fin" (or fin structure) extending from a substrate.

Although existing FinFET manufacturing processes have generally been adequate for their intended purposes, they have not been entirely satisfactory in all respects, especially as device scaling-down continues. For example, in the manufacturing of ICs, source/drain contacts are used for connecting to the source/drain regions. However, it is a challenge to form reliable source/drain contacts at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 2A to 2D illustrate the cross-sectional representations of the semiconductor device structure shown along line 2-2' in FIGS. 1A to 1D in accordance with some embodiments.

DETAILED DESCRIPTION

Figure 1A:
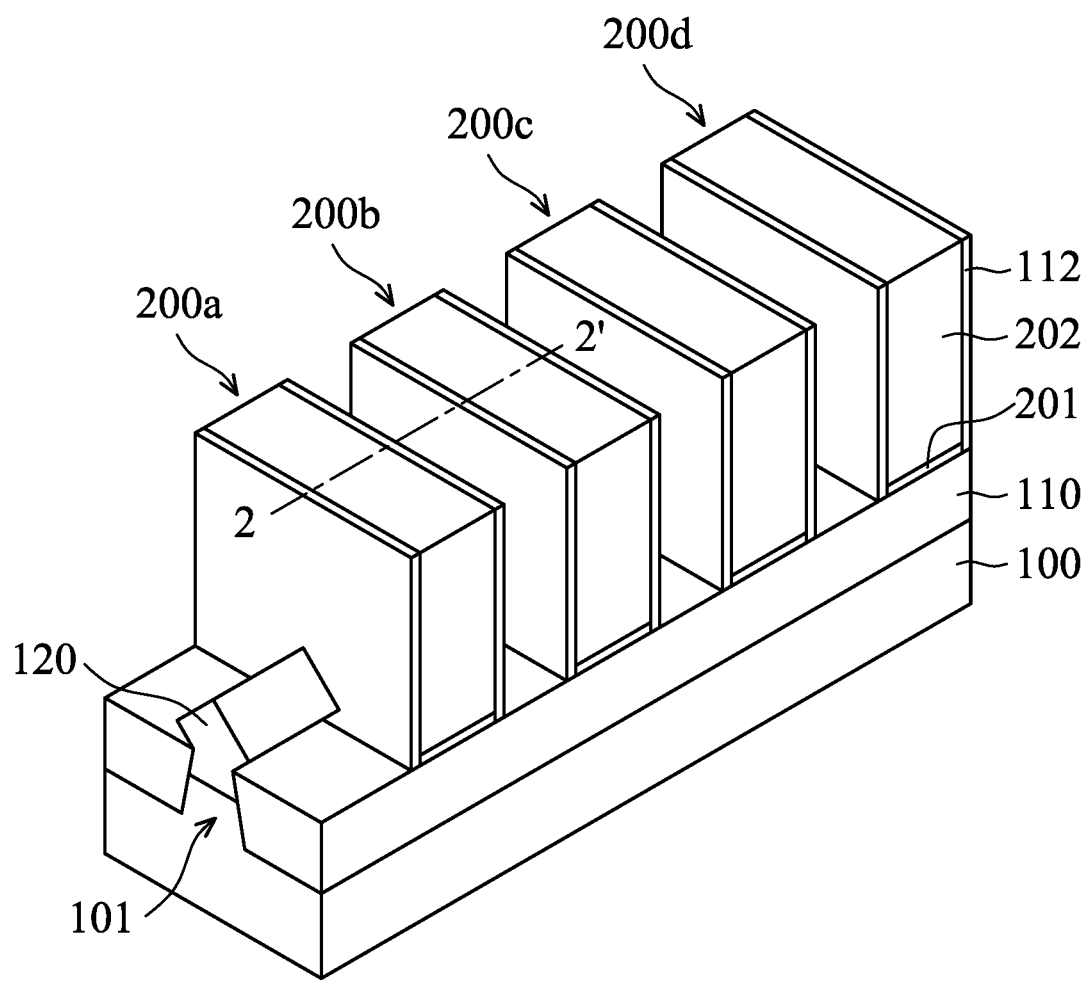
FIGS. 1A to 1D illustrate perspective views of various stages of manufacturing a semiconductor device structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Embodiments for manufacturing semiconductor device structures are provided. The semiconductor device structures includes an insulating capping layer formed over a gate electrode layer over a substrate, and a self-aligned contact structure formed over a conductive feature (e.g., source/drain feature) and separated from the gate electrode layer by an air spacer (which is sometimes referred to as an air gap). As a result, the parasitic capacitance between the gate electrode layer and the self-aligned contact structure can be reduced due to the air spacer, and therefore the effect of interconnect capacitance on RC delay can be reduced. The source/drain feature includes a doping region therein, in which the source/drain feature and the doping region have the same conductivity type, and the source/drain feature has a doping concentration less than that of the doping region. As a result, the source/drain feature can be activated to reduce the contact resistance between the source/drain feature and the overlying self-aligned contact structure. In addition, the side edge of the doping region is separated from the sidewall of the gate electrode layer by a portion of the source/drain feature, so as to prevent the doping region extended below the gate electrode layer. As a result, leakage and drain-induced barrier lowering (DIBL) effect can be mitigated or eliminated, thereby maintaining or improving the device performance.

FIGS. 1A to 1D illustrate perspective views of various stages of manufacturing a semiconductor device structure and FIGS. 2A to 2J illustrate cross-sectional representations of various stages of manufacturing the semiconductor device structure in accordance with some embodiments. In addition, FIGS. 2A to 2D illustrate the cross-sectional representations of the semiconductor device structure shown along line 2-2' in FIGS. 1A to 1D in accordance with some embodiments. In some embodiments, the semiconductor device structure is implemented as a fin field effect transistor (FinFET) structure. As show in FIGS. 1A and 2A, a substrate 100 is provided. In some embodiments, the substrate 100 is a semiconductor substrate, such as a bulk semiconductor, a semiconductor-on-insulator (SOI) substrate, or the like, which may be doped (e.g. with a P-type or an N-type impurity) or undoped. In some embodiments, the substrate 100 is a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate.

Other substrates, such as a multi-layered or gradient substrate may also be used. In some embodiments, the semiconductor material of the substrate 100 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. In some embodiments, the substrate 100 includes silicon. In some embodiments, the substrate 100 includes an epitaxial layer. For example, the substrate 100 has an epitaxial layer overlying a bulk semiconductor.

In some embodiments, the substrate 100 has a PMOS region for P-type FinFETs formed thereon and/or an NMOS region for N-type FinFETs formed thereon. In some embodiments, the PMOS region of the substrate 100 includes Si, SiGe, SiGeB, or an III-V group semiconductor material (such as InSb, GaSb, or InGaSb). The NMOS region of the substrate 100 includes Si, SiP, SiC, SiPC, or an III-V group semiconductor material (such as InP, GaAs, AlAs, InAs, InAlAs, or InGaAs).

Afterwards, a fin structure 101 is formed over a substrate 100 in accordance with some embodiments. In some embodiments, the substrate 100 is patterned to form the fin structure 101. The fin structure 101 may have slope sidewalls, so that the fin structure 101 has a top width that is narrower than that of the bottom width, as shown in FIG. 1A.

After the fin structure 101 is formed, an isolation feature 110, such as an shallow trench isolation (STI) structure, is formed over the substrate 100, as shown in FIG. 1A in accordance with some embodiments. The isolation feature 110 surrounds the fin structure 101. The isolation feature 110 may be formed by depositing an insulating layer over the substrate 100 and then etching back the insulating layer. As an example, the isolation feature 110 is made of silicon oxide, silicon nitride, silicon oxynitride, fluorosilicate glass (FSG), low-K dielectric materials, and/or another suitable dielectric material. The insulating layer for formation of the isolation feature 110 may be deposited by a flowable CVD (FCVD) process, a chemical vapor deposition (CVD) process, an atomic layer deposition (ALD) process, or another applicable process. The etching back of the insulating layer may be performed using a dry etching process, wherein $HF_3$ and $NH_3$, for example, are used as the etching gases. Alternatively, the etching back of the insulating layer may be performed using a wet etching process. The etching chemical may include HF, for example.

Dummy gate stacks 200a, 200b, 200c, and 200d are formed across the fin structure 101 over the substrate 100 and cover the isolation feature 110, as shown in FIG. 1A in accordance with some embodiments. In some embodiments, each of the dummy gate stacks 200a, 200b, 200c, and 200d include a dummy gate dielectric layer 201 and a dummy gate electrode layer 202 formed over the dummy gate dielectric layer 201. In some embodiments, the dummy gate dielectric layer 201 is made of silicon oxide. In some embodiments, the dummy gate electrode layer 202 is made of polysilicon, and other materials is also be used.

After the dummy gate stacks 200a, 200b, 200c, and 200d are formed, gate spacers 112 are formed on the opposite sides (e.g., sidewalls) of the dummy gate stacks 200a, 200b, 200c, and 200d. The gate spacer 112 may be used for protecting dummy gate structure 200a, 200b, 200c, and 200d from damage or loss during subsequent processing. In some embodiments, the gate spacer 112 is made of low-K dielectric material, silicon nitride, silicon oxide, silicon oxynitride, silicon carbide, or another applicable dielectric material. The gate spacer 112 may have a single-layer structure or a multi-layer structure including a plurality of dielectric layers.

Figure 2A:
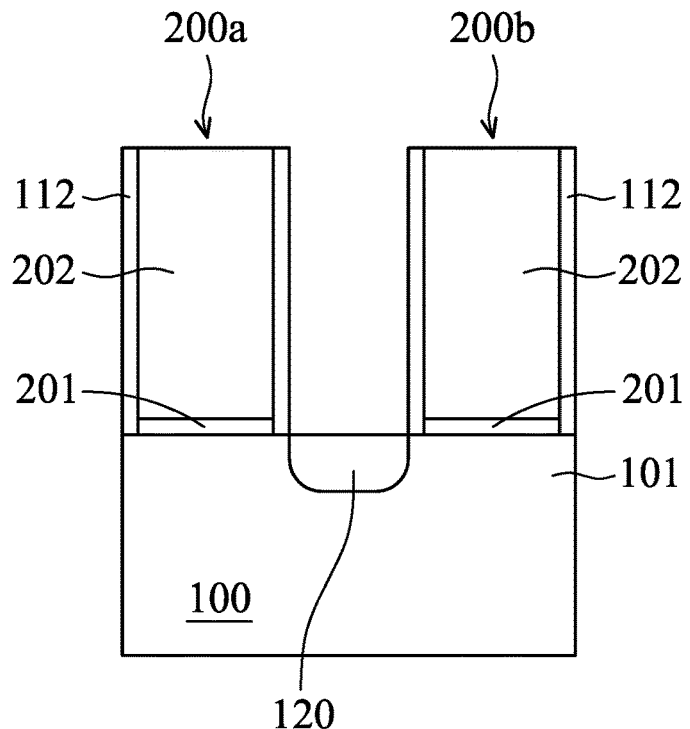
FIGS. 2A to 2J illustrate cross-sectional representations of various stages of manufacturing the semiconductor device structure in accordance with some embodiments.

After formation of the gate spacers 112, conductive features 120 (which are also referred to as source/drain features) are formed in the fin structure 101 that is adjacent to and exposed from the dummy gate stacks 200a, 200b, 200c, and 200d, as shown in FIGS. 1A and 2A in accordance with some embodiments. In some embodiments, the source/drain feature 120 is formed by recessing a portion of the fin structure 101 that is exposed from the dummy gate stacks 200a, 200b, 200c, and 200d, and growing a semiconductor material in the formed recess in the fin structure 101 by performing epitaxial (epi) growth processes. In some embodiments, the semiconductor device structure is an NMOS device, and the source/drain feature 120 is made of an epitaxial material including Si, SiP, SiC, SiPC, or an III-V group semiconductor material (such as InP, GaAs, AlAs, InAs, InAlAs, or InGaAs), or the like. Moreover, the source/drain feature 120 is doped with an n-type impurity, which may be phosphorus, arsenic, antimony, or the like. In some embodiments, the semiconductor device structure is a PMOS device, and the source/drain feature 120 is made of an epitaxial material including Si, SiGe, SiGeB, or an III-V group semiconductor material (such as In Sb, GaSb, or InGaSb), or the like. Moreover, the source/drain feature 120 is doped with a p-type impurity, which may be boron, indium, or the like. In some embodiments, the source/drain features 120 protrude above the isolation feature 110.

Figure 1B:
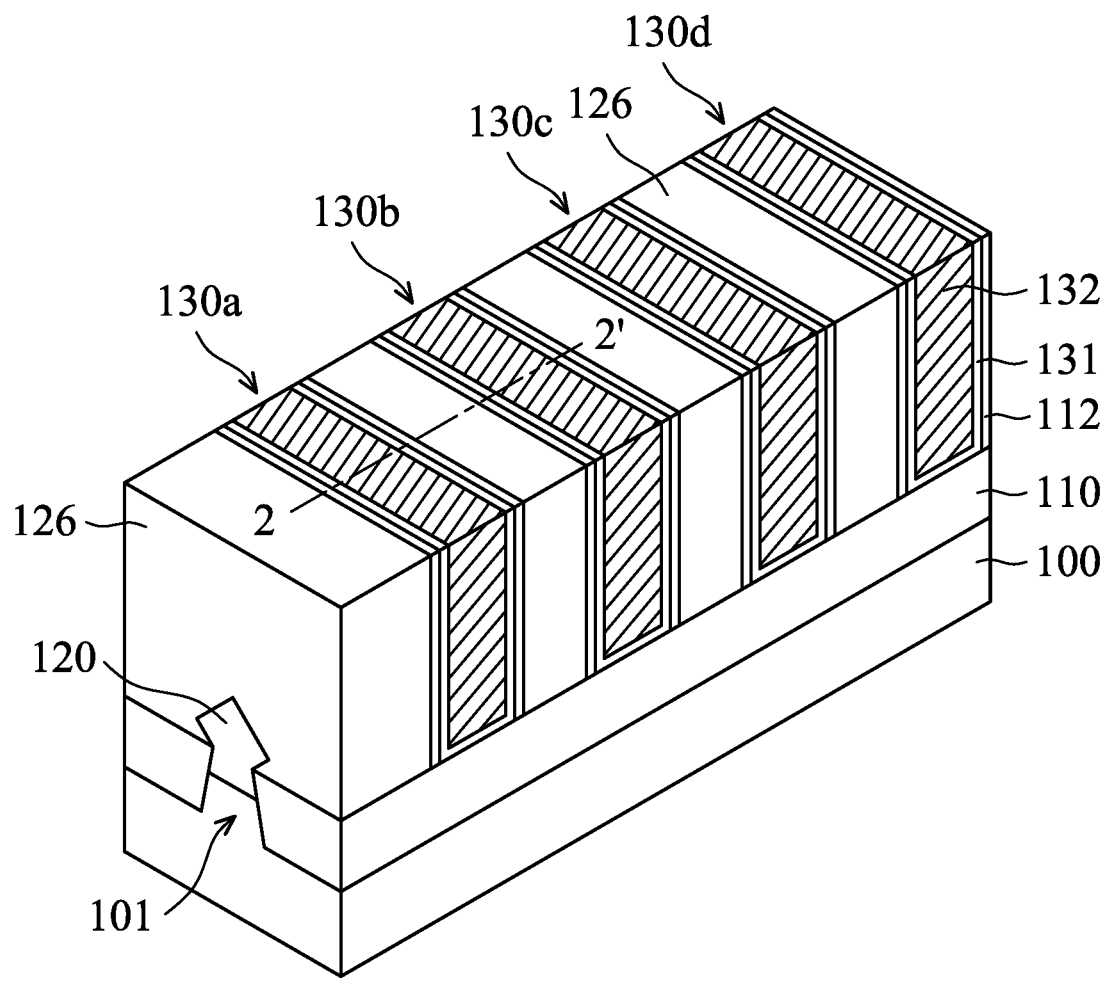
Figure 2B:
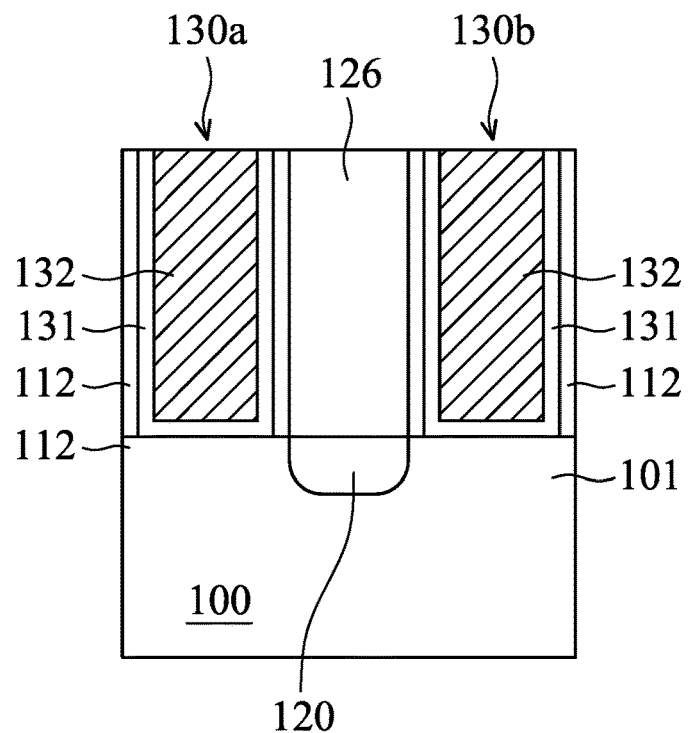

After the source/drain features 120 are formed, an insulating layer 126 is formed over the isolation feature 110 and covers the source/drain features 120 and the isolation feature 110, as shown in FIGS. 1B and 2B in accordance with some embodiments. The insulating layer 126 (which serves as an interlayer dielectric (ILD) layer) may be made of silicon oxide, tetraethyl orthosilicate (TEOS), phosphosilicate glass (PSG), borosilicate glass (BSG), boron-doped phosphosilicate Glass (BPSG), fluorosilicate glass (FSG), undoped silicate glass (USG), or the like, and may be deposited by any suitable method, such as a chemical vapor deposition (CVD) process, a plasma enhanced CVD (PECVD) process, flowable CVD (FCVD) process, the like, or a combination thereof. The insulating layer 126 may be a single layer or include multiple dielectric layers with the same or different dielectric materials. A planarization process such as a chemical mechanical polishing (CMP) process or a mechanical grinding process may be performed to level the top surface of the insulating layer 126, the dummy gate stacks 200a, 200b, 200c, and 200d, and the gate spacers 112 with each other.

Afterwards, the dummy gate stacks 200a, 200b, 200c, and 200d are removed, so as to be replaced by gate structures 130a, 130b, 130c, and 130d, as shown in FIGS. 1B and 2B in accordance with some embodiments. In some embodiments, each of the gate structures 130a, 130b, 130c, and 130d includes a gate dielectric layer 131, a gate electrode layer 132, and the gate spacers 112. In some embodiments, the gate dielectric layer 131 is made of high-K dielectric materials, such as metal oxides, metal nitrides, metal silicates, transition metal-oxides, transition metal-nitrides, transition metal-silicates, or oxynitrides of metals. Examples of the high-K dielectric material include, but are not limited to, hafnium oxide ($HfO_2$), hafnium silicon oxide (HfSiO), hafnium tantalum oxide (HMO), hafnium titanium oxide (HfTiO), hafnium zirconium oxide (HfZrO), zirconium oxide, titanium oxide, aluminum oxide, or another applicable dielectric material.

In some embodiments, the gate electrode layer 132 is made of a conductive material, such as aluminum, copper, tungsten, titanium, tantalum, or another applicable material. Each of the gate structures 130a, 130b, 130c, and 130d may further include a work functional metal layer (not shown) between the gate dielectric layer 131 and the gate electrode layer 132, so that the gate structures 130a, 130b, 130c, and 130d have the proper work function values. An exemplary p-type work function metal layer may be made of TiN, TaN, Ru, Mo, Al, WN, $ZrSi_2$, $MoSi_2$, $TaSi_2$, $NiSi_2$, WN, or a combination thereof. An exemplary n-type work function metal layer may be made of Ti, Ag, TaAl, TaAlC, TiAlN, TaC, TaCN, TaSiN, Mn, Zr, or a combination thereof.

Figure 1C:
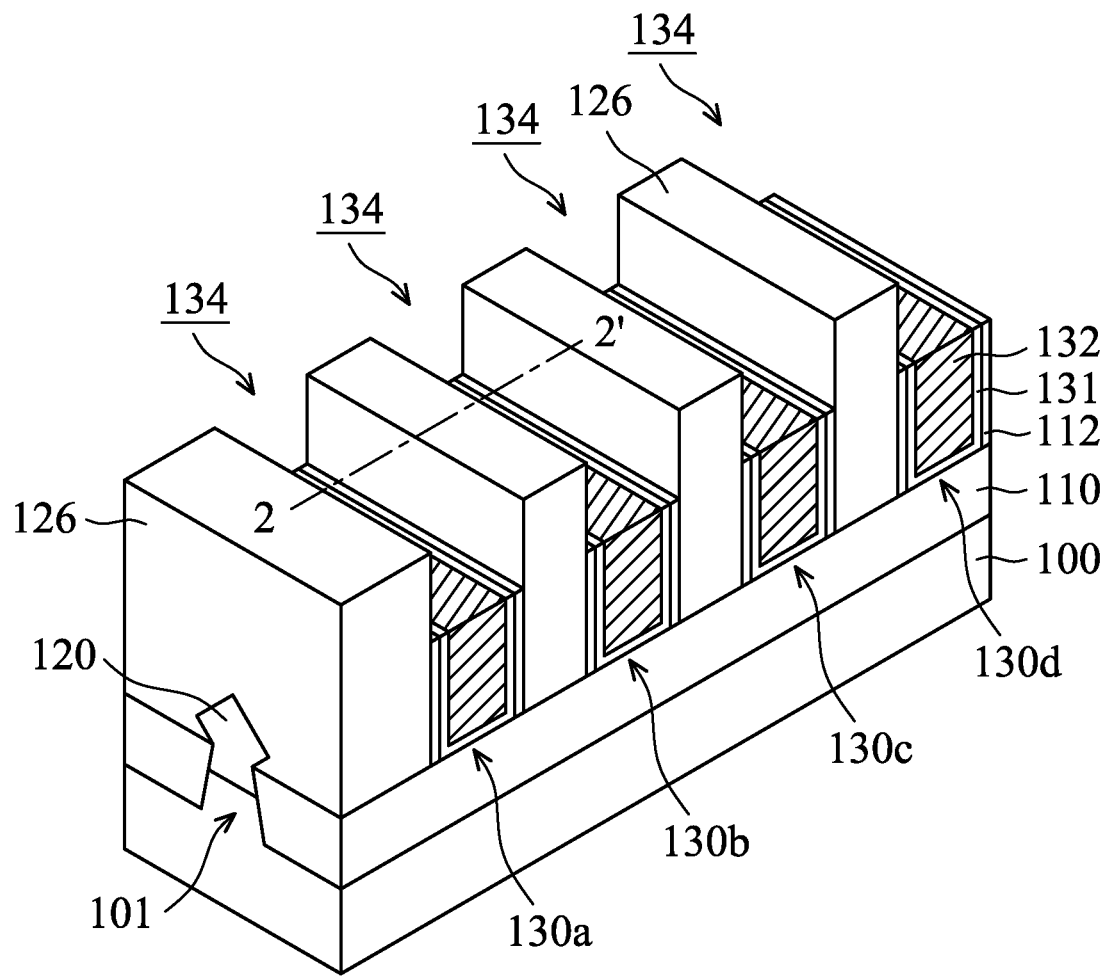
Figure 2C:
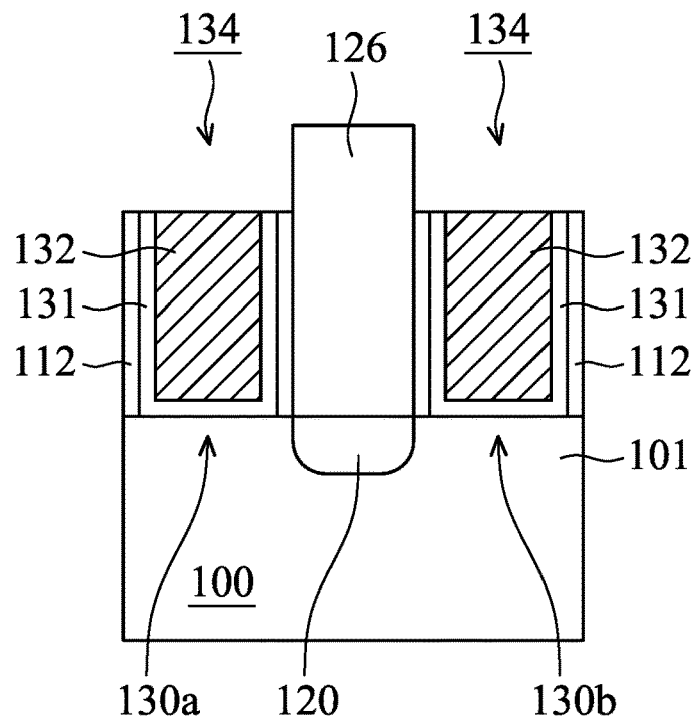

Afterwards, the gate structures 130a, 130b, 130c, and 130d are recessed by etching, so as to form recesses 134, as shown in FIGS. 1C and 2C in accordance with some embodiments. Top portions of the gate dielectric layers 130, the gate spacers 112 are also recessed during the etching, so that upper sidewalls of the insulating layer 126 are exposed by the recesses 134 in accordance with some embodiments.

Figure 1D:
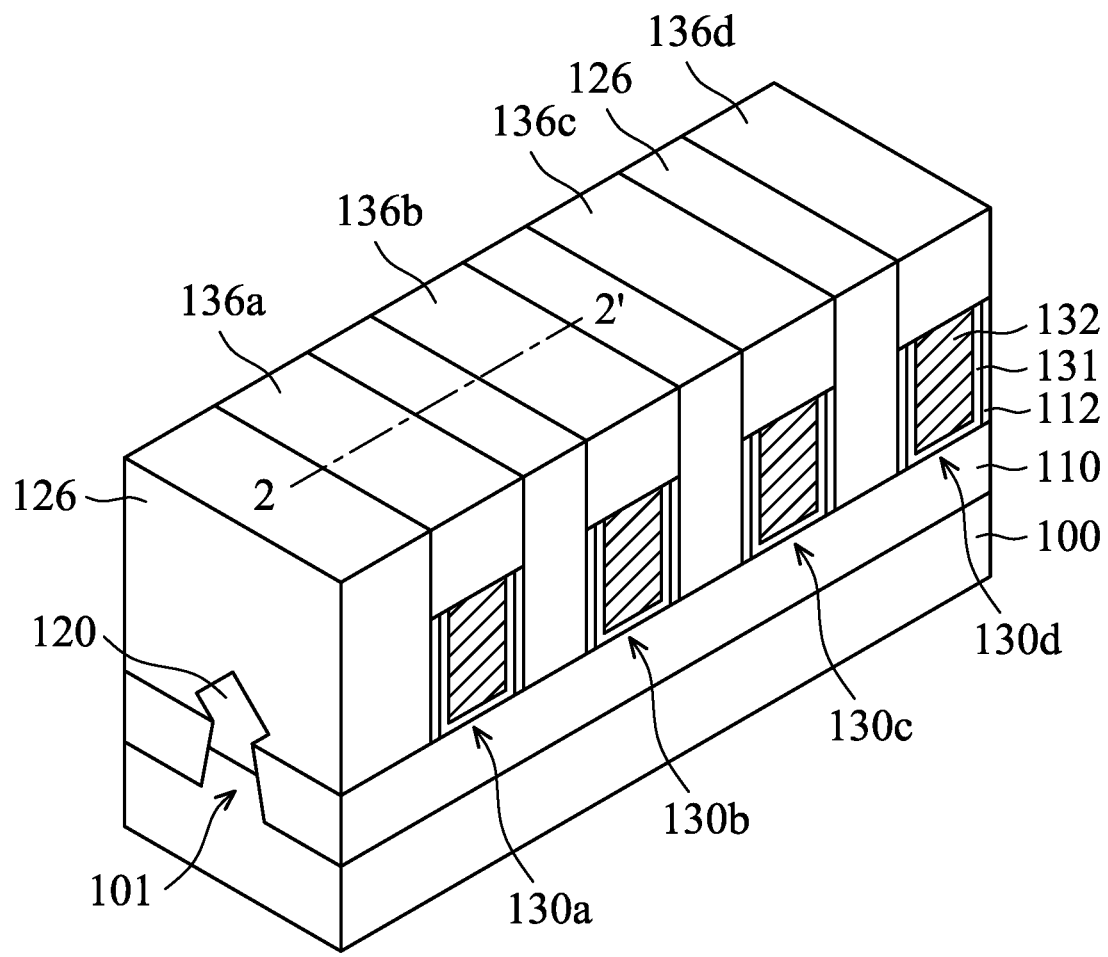
Figure 2D:
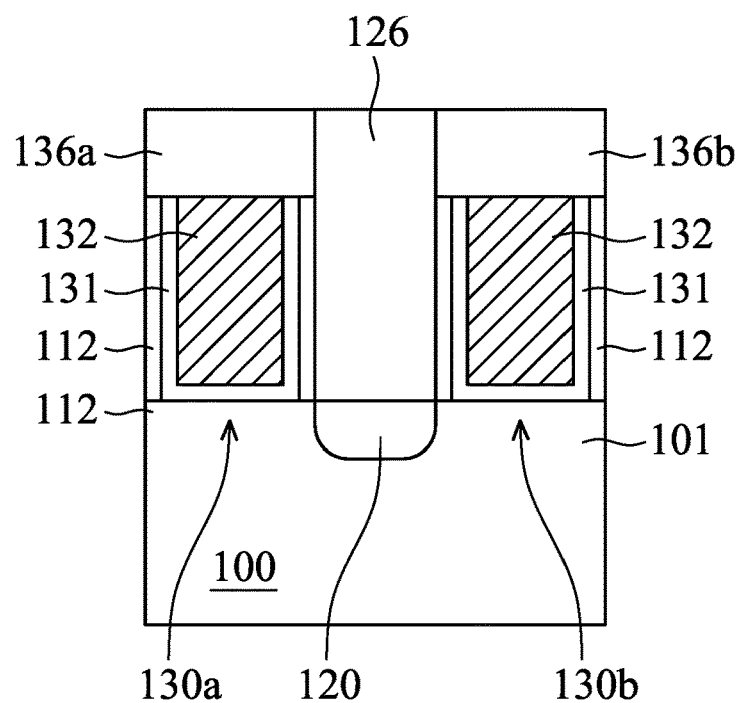

Afterwards, insulating capping layers 136a, 136b, 136c, and 136d are respectively formed in the recesses 134 (not shown and as indicated in FIGS. 1C and 2C) over the gate structures 130a, 130b, 130c, and 130d, as shown in FIGS. 1D and 2D in accordance with some embodiments. The insulating capping layers 136a, 136b, 136c, and 136d may protect the gate structures 130a, 130b, 130c, and 130d in the subsequent manufacturing processes (e.g., etching processes). In some embodiments, lower surfaces of the insulating capping layers 136a, 136b, 136c, and 136d are substantially level with the top surfaces of the corresponding gate spacers 112.

In some embodiments, the insulating capping layers 136a, 136b, 136c, and 136d are made of SiON, $Ta_2O_5$, $Al_2O_3$, or $ZrO_2$. In some other embodiments, the insulating capping layers 136a, 136b, 136c, and 136d are made of Al-containing oxide, N-containing oxide, Hf-containing oxide, Ta-containing oxide, Ti-containing oxide, Zr-containing oxide, La-containing oxide, or another metal-containing oxide or high-K (e.g., K>5) dielectric material.

In some other embodiments, the gate structures 130a, 130b, 130c, and 130d are recessed, so that the recesses 134 (as shown in FIGS. 1C and 2C) are not formed. In those cases, the formation of the insulating capping layers 136a, 136b, 136c, and 136d can be omitted.

After the insulating capping layers 136a, 136b, 136c, and 136d are formed, the insulating layer 126 is patterned to form one or more self-aligned trenches 140 between adjacent capping layers (e.g., capping layers 136a and 136b) and between adjacent gate structures (e.g., gate structures 130a and 130b). As a result, the top surface of source/drain feature 120 is exposed, as shown in FIG. 2F in accordance with some embodiments. As an example, the self-aligned trench 140 may be formed by etching the insulating layer 126 using the insulating capping layers 136a and 136b as an etch mask, so as to define a source/drain contact region between the gate structures 130a and 130b. The source/drain contact region defined by the self-aligned trench 140 provide a maximum critical dimension (CD) compared to cases where the source/drain contact regions are defined by a non-self-aligned opening.

Afterwards, a doping region 146 is formed within the source/drain feature 120, as shown in FIG. 2F in accordance with some embodiments. In some embodiments, the doping region 146 is formed by performing an ion implantation process 142 on the source/drain contact region (i.e., the source/drain feature 120 in the self-aligned trench 140 between the gate structures 130a and 130b. The formed doping region 146 has side edges adjoining to the sidewalls of the self-aligned trench 140, so that the top width of the formed doping region 146 is substantially equal to the top width of the source/drain feature 120. If the semiconductor device structure is an NMOS device, the doping region 146 includes an n-type impurity (e.g., phosphorus, arsenic, antimony, or the like) after performing the ion implantation process 142. If the semiconductor device structure is a PMOS device, and the doping region 146 includes a p-type impurity (e.g., boron, indium, or the like) after performing the ion implantation process 142. In some embodiments, the source/drain feature 120 and the doping region 146 have the same conductivity type, and the source/drain feature 120 has a doping concentration less than that of the doping region 146. Therefore, the source/drain feature 120 can be activated to reduce the contact resistance between the source/drain feature 120 and the subsequently formed self-aligned contact structure.

Figure 2E:
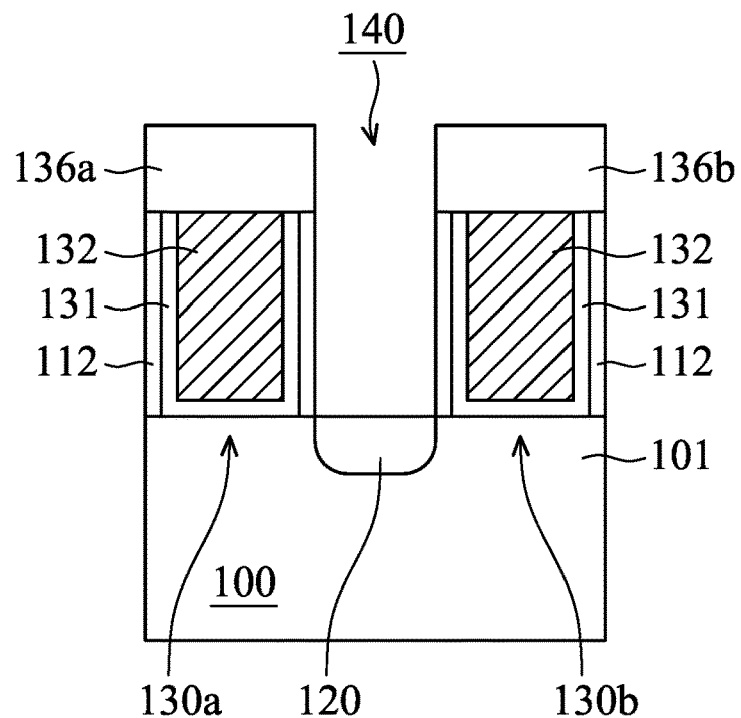
Figure 2F:
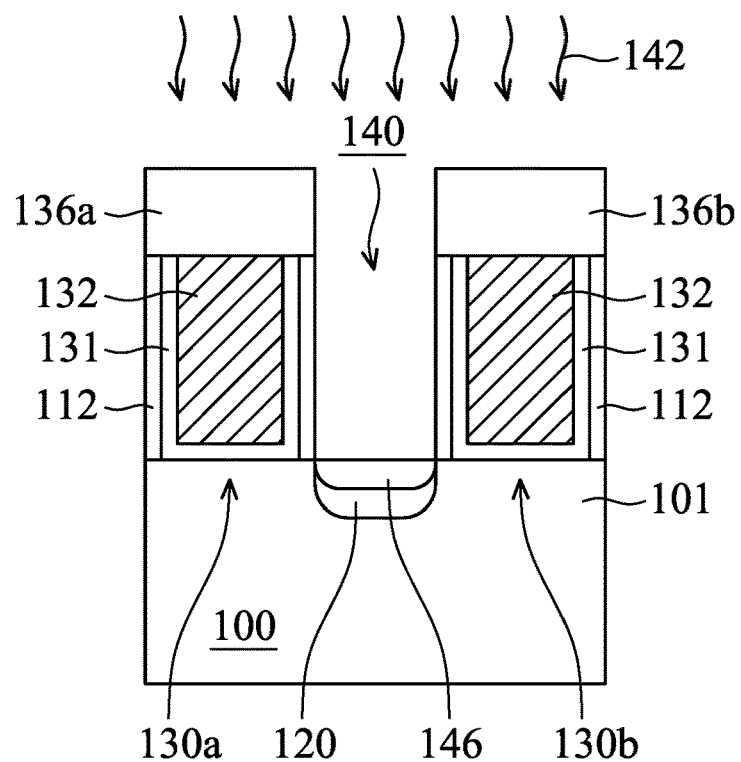
Figure 2G:
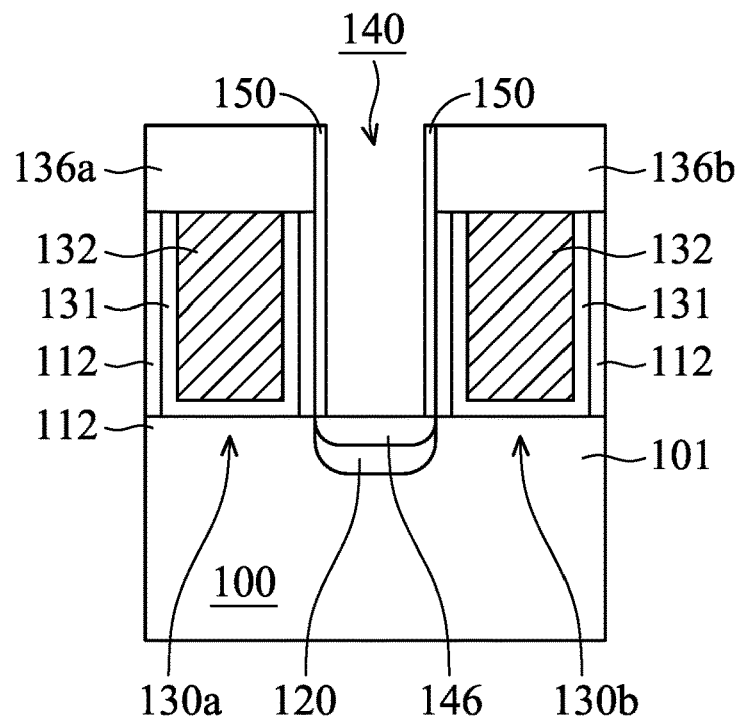

After the doping region 146 is formed, spacers 150 are formed over the two opposite sidewalls of the trench 140, respectively, as shown in FIG. 2G in accordance with some embodiments. In some embodiments, the spacers 150 are used as sacrificial layers and are replaced by air spacers in the subsequent processes. In some embodiments, the spacers 150 are made of a material different than the material of the insulating capping layers 136a and 136b to provide etching selectivity in subsequent processing. In some embodiments, the spacers 150 are made of a semiconductor material. Such as silicon, the like, or another suitable semiconductor material. The spacers 150 may be formed by a suitable formation method such as a chemical vapor deposition (CVD) process, a physical vapor deposition (PVD) process, an atomic layer deposition (ALD) process, or the like. In some embodiments, the spacer 150 is formed having a desired thickness that is depended on the width of the subsequently formed air spacer. For example, the spacer 150 has a thickness in a range from about 1 nm to about 5 nm.

Figure 2H:
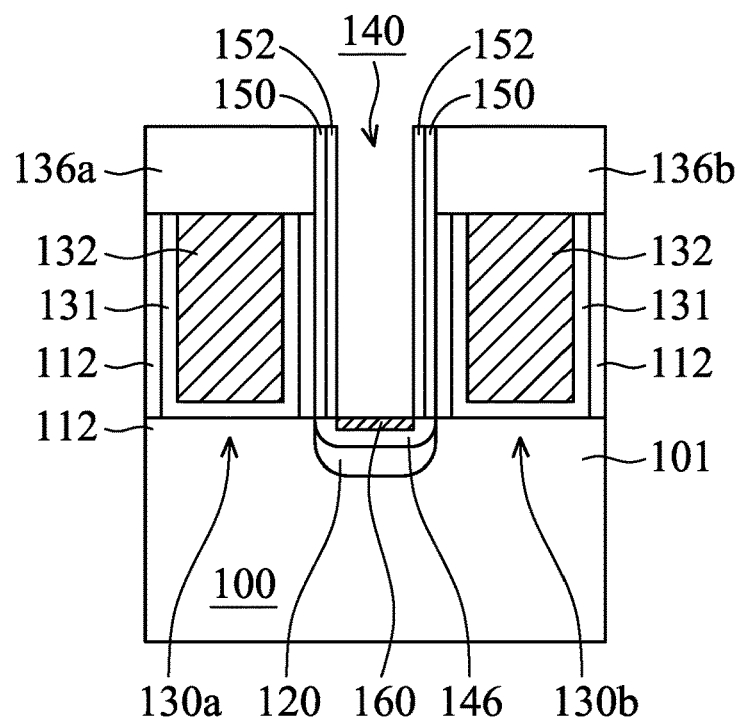

After the spacers 150 are formed, spacers 152 are formed in the self-aligned trench 140 and adjacent to the spacers 150, respectively, as shown in FIG. 2H in accordance with some embodiments. In some embodiments, the spacers 152 are used as barrier layers to prevent the spacers 150 from being reacted with a metal material in the subsequent salicide process. Moreover, the spacers 152 also serve as a support structure to sustain the filling material in the subsequent formation of conductive connecting structure.

In some embodiments, the spacers 152 are made of a material that is different than the material of the spacers 150 to provide etching selectivity in subsequent processing. Moreover, the spacers 152 are made of an insulating material that is the same as the insulating material of the gate spacers 112. For example, the spacers 150 are made of silicon and the spacers 152 and the gate spacers 112 are made of silicon nitride. In some other embodiments, the spacers 152 are made of an insulating material that is different than the insulating material of the gate spacers 112. For example, the spacers 152 are made of low-K dielectric material, silicon nitride, silicon oxide, silicon oxynitride, silicon carbide, or another applicable dielectric material. The spacers 152 may be formed by a suitable formation method such as a CVD process, a PVD process, an ALD process, or the like. In some embodiments, the spacer 152 has a thickness in a range from about 1 nm to about 5 nm.

Afterwards, a salicide process may be performed to form a silicide region 160 (which is also referred to as a salicide region) in the doping region 146 and over the exposed top surface of the doping region 146. In some embodiments, the silicide region 160 may be formed by forming a metal layer (not shown) over the exposed top surface of the doping region 146. Afterwards, an annealing process is performed on the metal layer so the metal layer reacts with the doping region 146. Afterwards, the unreacted metal layer is removed to form the silicide region 160. Examples for forming the metal layer includes Ti, Co, Ni, NiCo, Pt, Ni(Pt), Ir, Pt(Ir), Er, Yb, Pd, Rh, Nb, TiSiN, and the like.

Figure 2I:
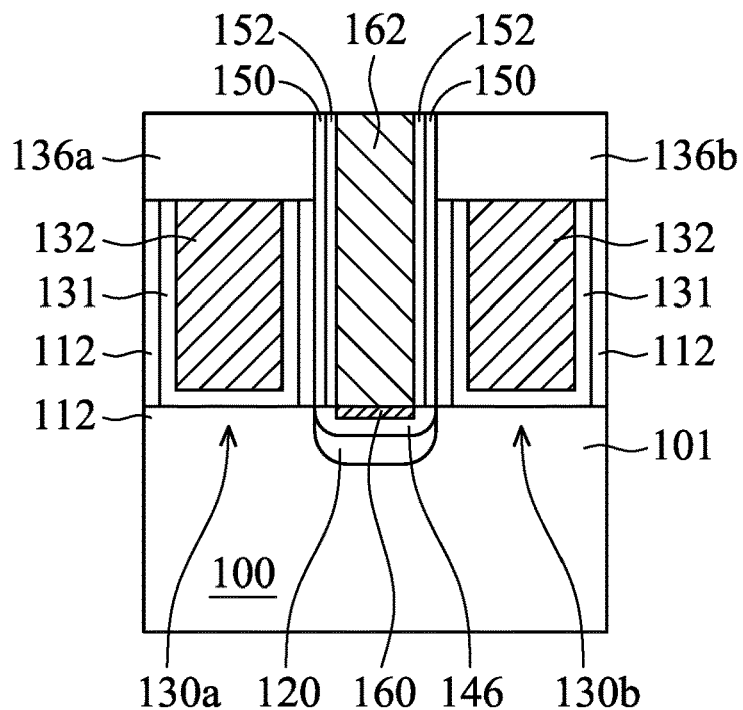

After the spacers 150 and 152 and the silicide region 160 are formed, a conductive material layer 162 fills the self-aligned trench 140, as shown in FIG. 2I in accordance with some embodiments. More specifically, a conductive material (not shown) is formed over the insulating capping layers 136a and 136b and fills the self-aligned trench 140 to contact with the silicide region 160. For example, the conductive material is made of Ru, Ni, Rh, Al, Mo, W, Co, Cu, or metal compound, or the like. The conductive material may be formed by a CVD process, a PVD process, an ALD process, an electroless deposition (ELD) process, an electrochemical plating (ECP) process, or another applicable process.

Afterwards, a planarization process such as a CMP process or a mechanical grinding process may be performed to remove the excess conductive material over the insulating capping layers 136a and 136b. The conductive material layer 132 has a top surface that is level the top surface of the insulating capping layers 136a and 136b, and the spacers 150 and 152 with each other. After the planarization process, the remaining conductive material forms the conductive material layer 162 that are sandwiched between the spacers 152. Moreover, the conductive material layer 162 is electrically connected to the underlying source/drain feature 120 via the doping region 146 and the silicide region 160.

Figure 2J:
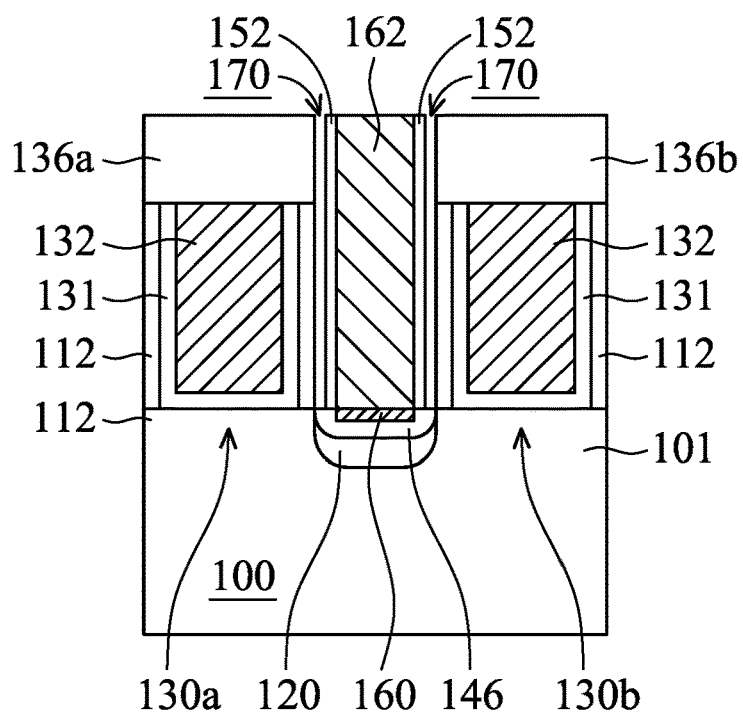

After forming the conductive material layer 162, air spacers 170 are formed separate the gate structures 130a and 130b from the conductive connecting structure formed in the self-aligned trench 140, as shown in FIG. 2J in accordance with some embodiments. In some embodiments, the spacers 150 shown in FIG. 2I are removed by an etching process (such as a dry or wet etching process) to expose the doping region 146. The remaining spacers 152 and the remaining conductive material layer 162 in the self-aligned trench 140 form the conductive connecting structure (which is also referred to as a source/drain contact structure or a self-aligned contact structure). Two opposite sidewalls of the source/drain contact structure are respectively separated from the two opposite sidewalls of the self-aligned trench 140 due to the air spacers 170. As a result, the parasitic capacitance between the gate electrode layer 132 and the source/drain contact structure can be reduced, and therefore the effect of interconnect capacitance on RC delay can be reduced.

Many variations and/or modifications can be made to embodiments of the disclosure. For example, FIGS. 2F-2J show that the doping region 146 has side edges adjoining to the sidewalls of the self-aligned trench 140, so that the top width of the formed doping region 146 is substantially equal to the top width of the source/drain feature 120, but embodiments of the disclosure are not limited. The side edges of the doping region 146 may not adjoin to the sidewalls of the self-aligned trench 140. FIGS. 3A to 3G illustrate cross-sectional representations of various stages of manufacturing the semiconductor device structure in accordance with some embodiments. The semiconductor device structure shown in FIG. 3G is similar to the semiconductor device structure shown in FIG. 2I. In some embodiments, the materials, formation methods, and/or benefits of the semiconductor device structure shown in FIGS. 2A to 2I can also be applied in the embodiments illustrated in FIG. 3A to 3G, and may be therefore not repeated.

Figure 3A:
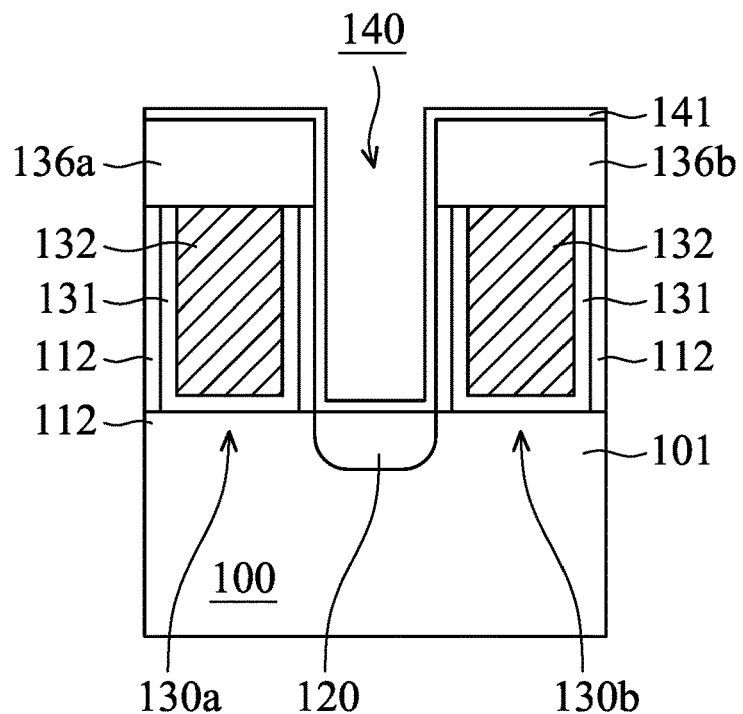
FIGS. 3A to 3G illustrate cross-sectional representations of various stages of manufacturing the semiconductor device structure in accordance with some embodiments.

As shown in FIG. 3A, a structure as shown in FIG. 2E is provided. Unlike the method shown in FIG. 2F, a sacrificial liner layer 141 is formed prior to the ion implantation process 142. The sacrificial liner layer 141 is formed over two opposite sidewalls and a bottom of the self-aligned trench 140 to cover the source/drain feature 120 below the self-aligned trench 140, as shown in FIG. 3A in accordance with some embodiments. In some embodiments, the sacrificial liner layer 141 conformally covers the top surfaces and the sidewalls of the insulating capping layers 136a and 136b, the sidewalls of the gate structures 130a and 130b exposed from the self-aligned trench 140, and the top surface of the source/drain feature 120.

In some embodiments, the sacrificial liner layer 141 is used as a blocking layer to constrain the implantation area in the self-aligned trench 140 during the subsequent ion implantation process 142. In some embodiments, the sacrificial liner layer 141 is made of an insulating material, such as silicon nitride, silicon oxide, silicon oxynitride, silicon carbide, the like, or another suitable insulating material. The sacrificial liner layer 141 may be formed by a suitable formation method, such as a CVD process, a PVD process, an ALD process, or the like. In some embodiments, the sacrificial liner layer 141 is formed having a suitable thickness that is depended on the desired distances between the side edges of the subsequently formed doping region 146 and the corresponding sidewalls of the gate structures 130a and 130b. For example, the sacrificial liner layer 141 has a thickness in a range from about 1 nm to about 5 nm.

Figure 3B:
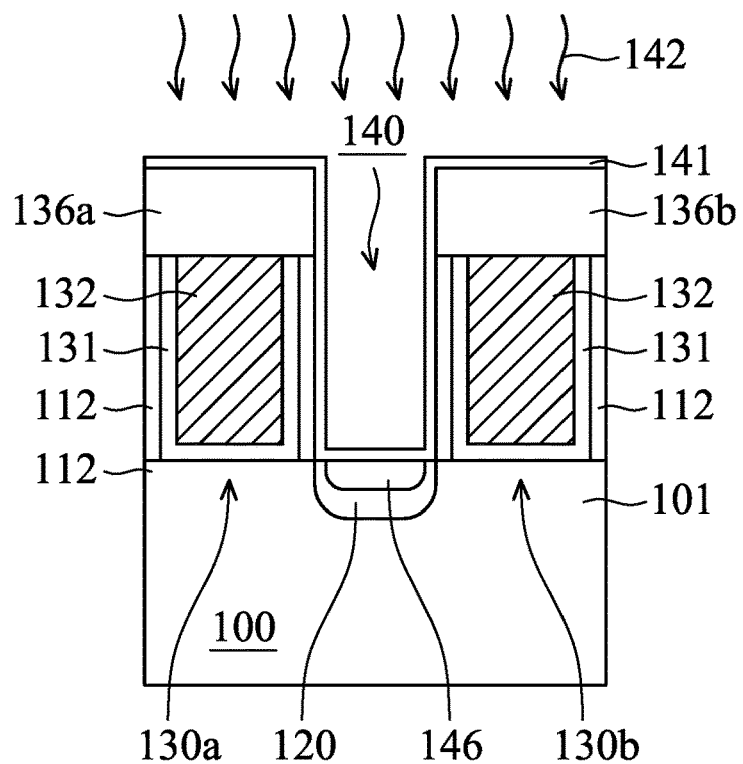

Afterwards, an ion implantation process 142 as described above and referred to in FIG. 2F is performed on the source/drain feature 120 in the self-aligned trench 140 between the gate structures 130a and 130b to form a doping region 146 in the source/drain feature 120, as shown in FIG. 3B in accordance with some embodiments. Unlike the formed doping region 146 shown in FIG. 2F, the formed doping region 146 has opposite side edges respectively separated from the corresponding sidewalls of the self-aligned trench 140 (i.e., the corresponding sidewalls of the gate structures 130a and 130b), so that the top width of the formed doping region 146 is substantially less than the top width of the source/drain feature 120. The source/drain feature 120 can be activated by the formation of the doping region 146, thereby reducing the contact resistance between the source/drain feature 120 and the subsequently formed self-aligned contact structure.

Figure 3C:
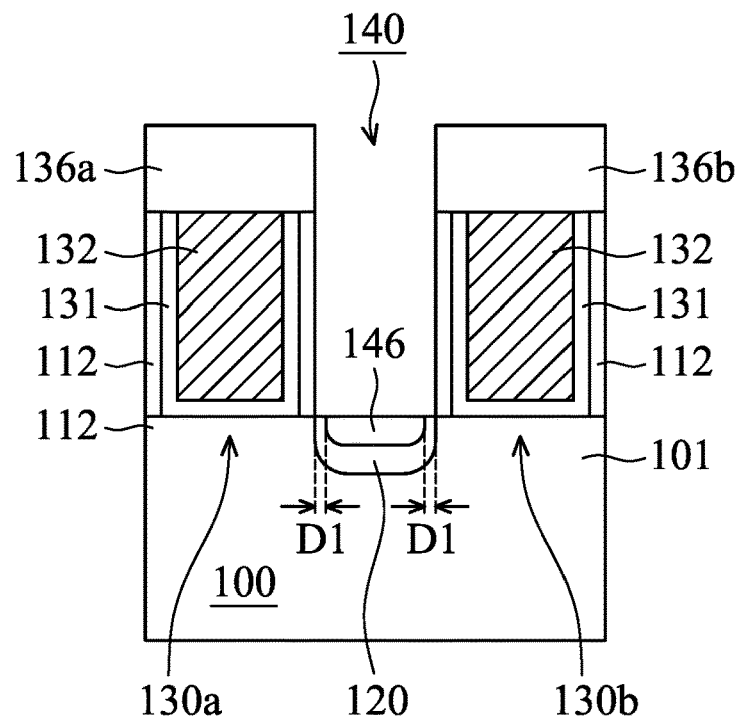

After the doping region 146 is formed, the sacrificial liner layer 141 is removed from the structure shown in FIG. 3B, to expose one of the sidewalls of the gate structures 130a and one of the sidewalls of the gate structures 130b, as shown in FIG. 3C in accordance with some embodiments. In some embodiments, the sacrificial liner layer 141 is removed by an etching process, such as a dry or wet etching process. As shown in FIG. 3C, the opposite side edges of the doping region 146 respectively separated from the corresponding sidewalls of the gate structures 130a and 130b by a distance D1, so that the top width of the formed doping region 146 is substantially less than the top width of the source/drain feature 120. In some embodiments, the distance D1 is substantially equal to the thickness of the sacrificial liner layer 141. In addition, the opposite side edges of the doping region 146 are separated from the corresponding sidewalls of the gate structures 130a and 130b by a corresponding portion of the source/drain feature 120, respectively.

Namely, the sacrificial liner layer 141 effectively prevents the subsequently formed doping region 146 from extending below the gate structures 130a and 130b. As a result, DIBL effect can be mitigated or eliminated, and leakage problem can be addressed, thereby maintaining or improving the performance of the semiconductor device.

Figure 3D:
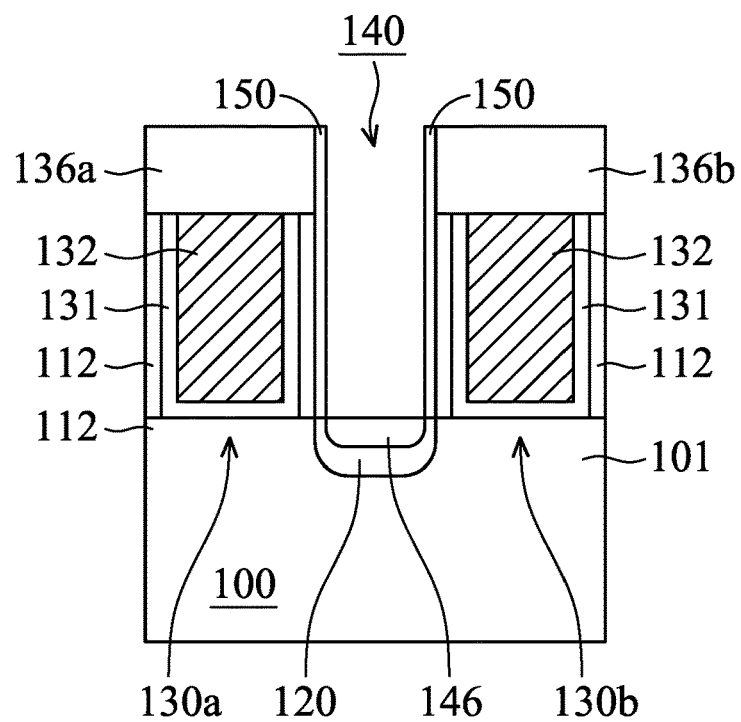

After the removal of the sacrificial liner layer 141, the spacers 150 are formed over the two opposite sidewalls of the trench 140, respectively, as shown in FIG. 3D in accordance with some embodiments. In some embodiments, the spacer 150 is formed having a desired thickness that is depended on the width of the subsequently formed air spacer. For example, the spacer 150 has a thickness in a range from about 1 nm to about 5 nm.

Figure 3E:
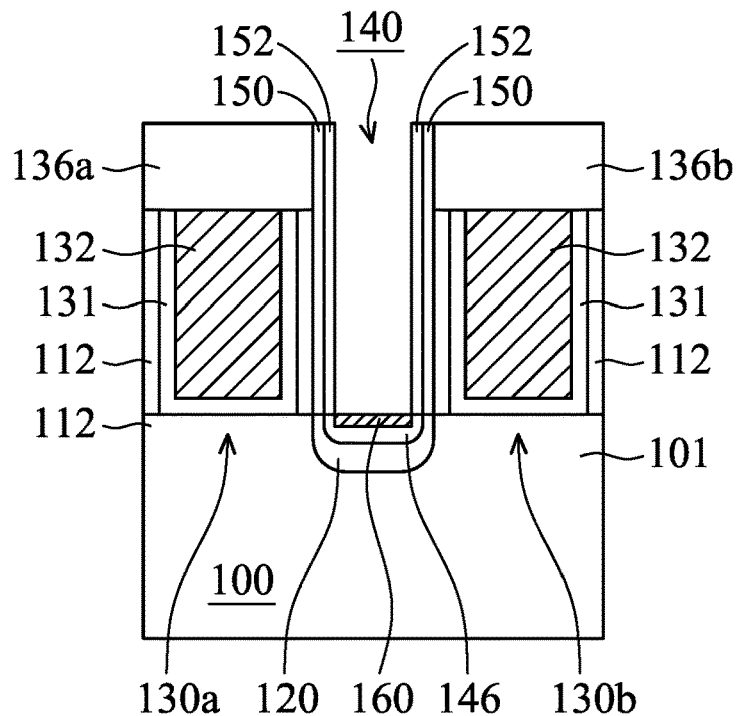

After the spacers 150 are formed, spacers 152 are formed in the self-aligned trench 140 and adjacent to the spacers 150, respectively, as shown in FIG. 3E in accordance with some embodiments. In some embodiments, the spacer 152 has a thickness in a range from about 1 nm to about 5 nm. Afterwards, a salicide process may be performed to form a silicide region 160 in the doping region 146 and over the exposed top surface of the doping region 146.

Figure 3F:
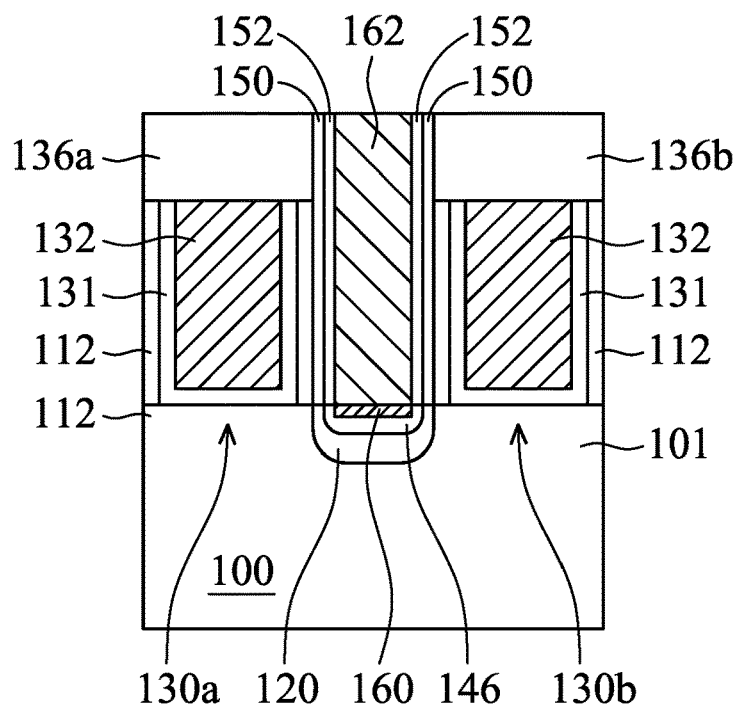
Figure 3G:
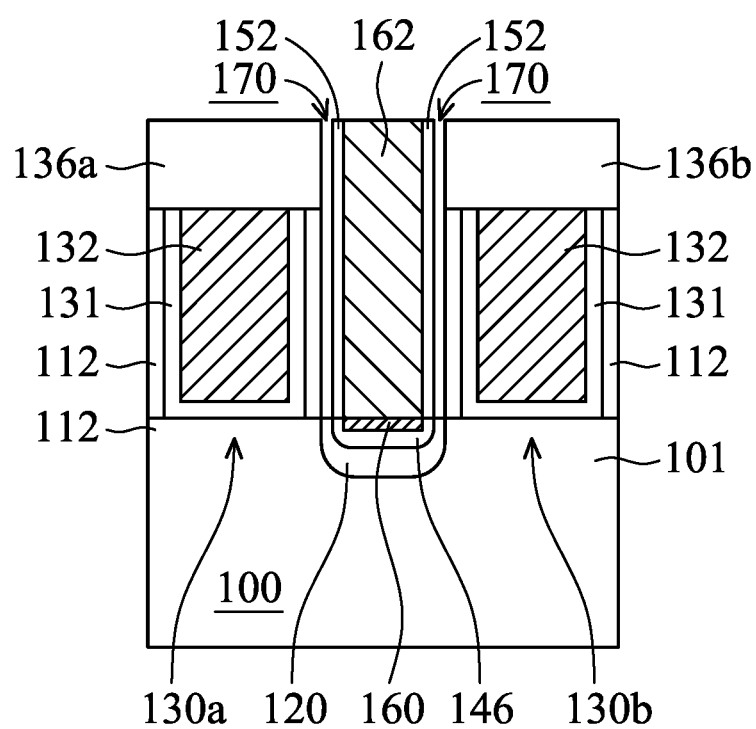

After the spacers 150 and 152 and the silicide region 160 are formed, a conductive material layer 162 fills the self-aligned trench 140, as shown in FIG. 3F in accordance with some embodiments. The conductive material layer 132 has a top surface that is level the top surface of the insulating capping layers 136a and 136b, and the spacers 150 and 152 with each other. Moreover, the conductive material layer 162 is electrically connected to the underlying source/drain feature 120 via the doping region 146 and the silicide region 160.

After forming the conductive material layer 162, air spacers 170 are formed separate the gate structures 130a and 130b from the conductive connecting structure (i.e., source/drain contact structure) formed in the self-aligned trench 140, as shown in FIG. 3G in accordance with some embodiments. In some embodiments, the air spacers 170 expose portions of the top surface of the source/drain feature 120. The remaining spacers 152 and the remaining conductive material layer 162 in the self-aligned trench 140 form the conductive connecting structure. Two opposite sidewalls of the source/drain contact structure are respectively separated from the two opposite sidewalls of the self-aligned trench 140 due to the air spacers 170.

Embodiments of semiconductor device structures and methods for forming the same are provided. The formation of the semiconductor device structure includes forming a trench in an insulating layer to expose a conductive feature below the insulating layer, and forming a sacrificial liner layer over two opposite sidewalls of the trench. Afterwards, ions are implanted into the conductive feature through the trench, so as to form a doping region in the conductive feature. The doping region has opposite side edges respectively separated from the two opposite sidewalls of the trench by a distance due to the formation of the sacrificial liner layer. Afterwards, the sacrificial liner layer is removed and a conductive connecting structure is formed in the trench to be electrically connected to the conductive feature. The two opposite sidewalls of the conductive connecting structure are respectively separated from the two opposite sidewalls of the trench by forming air spacers. Since the doping region is formed after forming the sacrificial liner layer in the trench, the conductive feature can be activated. Moreover, since the existence of the distance between the sidewall of the trench and the doping region, the doping region extended outside of the conductive feature can be prevented. As a result, device performance can be maintained or improved.

In some embodiments, a method of forming a semiconductor device structure is provided. The method includes forming an insulating layer over a semiconductor substrate that includes a conductive feature. The insulating layer includes a trench to expose the conductive feature. The method also includes forming a sacrificial liner layer over two opposite sidewalls and a bottom of the trench to cover the conductive feature below the trench and implanting ions into the conductive feature covered by the sacrificial liner layer, so that a doping region is formed in the conductive feature and has opposite side edges respectively separated from the two opposite sidewalls of the trench by a distance. In addition, the method includes removing the sacrificial liner layer in the trench after forming the doping region and forming a conductive connecting structure in the trench to be electrically connected to the conductive feature. Two opposite sidewalls of the conductive connecting structure are respectively separated from the two opposite sidewalls of the trench, so that an air spacer is formed between each of the two opposite sidewalls of the conductive connecting structure and the corresponding sidewall of the trench.

In some embodiments, a method of forming a semiconductor device structure is provided. The method includes forming a source/drain feature over a semiconductor substrate having a fin structure extending from the semiconductor substrate. The method also includes forming a first gate structure and a second gate structure across the fin structure and respectively adjacent to opposite sides of the source/drain feature and forming a sacrificial liner layer to cover a first sidewall of the first gate structure, a second sidewall of the second gate structure, and a top surface of the source/drain feature. The method further includes implanting ions into the source/drain feature covered by the sacrificial liner layer to form a doping region in the source/drain feature. The doping region has opposite side edges respectively separated from the first sidewall and the second sidewall. In addition, the method includes removing the sacrificial liner layer to expose the first sidewall and the second sidewall and forming a source/drain contact structure over the source/drain feature. Two opposite sidewalls of source/drain contact structure are respectively separated from the exposed first sidewall and the exposed second sidewall by air spacers.

In some embodiments, a semiconductor device structure is provided. The semiconductor device structure includes a semiconductor substrate having a fin structure extending from the semiconductor substrate, a source/drain feature adjacent to the fin structure, and a first gate structure across the fin structure and adjacent to the source/drain feature. The semiconductor device structure also includes a doping region formed in the source/drain feature and separated from a sidewall of the first gate structure by a first portion of the source/drain feature, and a silicide region formed in the doping region. In addition, the semiconductor device structure includes a source/drain contact structure formed over the source/drain feature. The source/drain contact structure includes a conductive material layer electrically connected to the doping region via the silicide region, and a first insulating spacer covering a first sidewall of the conductive material layer and separated from the sidewall of the first gate structure by a first air spacer.

The fins described above may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device structure, comprising:
   forming an insulating layer over a semiconductor substrate that comprises a conductive feature, wherein the insulating layer comprises a trench to expose the conductive feature;
   forming a sacrificial liner layer over two opposite sidewalls of the trench and a bottom surface of the trench to cover the conductive feature below the trench;
   implanting ions into the conductive feature covered by the sacrificial liner layer, so that a doping region is formed in the conductive feature and has two opposite side edges separated from the two opposite sidewalls of the trench by a distance;
   removing the sacrificial liner layer in the trench after forming the doping region; and
   forming a conductive connecting structure in the trench to be electrically connected to the conductive feature, wherein two opposite sidewalls of the conductive connecting structure are respectively separated from the two opposite sidewalls of the trench, so that an air spacer is formed between each of the two opposite sidewalls of the conductive connecting structure and a corresponding sidewall of the trench.

2. The method as claimed in claim 1, wherein the formation of the conductive connecting structure comprises:
   forming two first spacers over the two opposite sidewalls of the trench, respectively;
   forming two second spacers in the trench and adjacent to the first spacers, respectively;
   forming a conductive material layer in the trench that is sandwiched between the second spacers; and
   removing the first spacers to form the air spacers.

3. The method as claimed in claim 2, wherein the formation of the conductive connecting structure further comprises forming a silicide region in the doping region prior to the formation of the conductive material layer.

4. The method as claimed in claim 2, wherein the first spacers comprise a semiconductor material and the second spacers comprise an insulating material.

5. The method as claimed in claim 1, wherein the sacrificial liner layer comprises an insulating material.

6. The method as claimed in claim 1, wherein the conductive feature comprises an epitaxial material.

7. The method as claimed in claim 1, wherein the conductive feature and the doping region have the same conductivity type and wherein the conductive feature has a doping concentration less than that of the doping region.

8. The method as claimed in claim 1, wherein the distance is substantially equal to a thickness of the sacrificial liner layer.

9. A method of forming a semiconductor device structure, comprising:
   forming a source/drain feature over a semiconductor substrate having a fin structure extending from the semiconductor substrate;
   forming a first gate structure and a second gate structure across the fin structure and respectively adjacent to opposite sides of the source/drain feature;
   forming a sacrificial liner layer to cover a first sidewall of the first gate structure, a second sidewall of the second gate structure, and a top surface of the source/drain feature;
   implanting ions into the source/drain feature covered by the sacrificial liner layer to form a doping region in the source/drain feature, wherein the doping region has opposite side edges respectively separated from the first sidewall and the second sidewall;
   removing the sacrificial liner layer to expose the first sidewall and the second sidewall;
   forming a source/drain contact structure over the source/drain feature, wherein two opposite sidewalls of source/drain contact structure are respectively separated from the exposed first sidewall and the exposed second sidewall by air spacers.

10. The method as claimed in claim 9, wherein the formation of the source/drain contact structure comprises:
    forming two first spacers to cover the exposed first sidewall and the exposed second sidewall, respectively;
    forming two second spacers adjacent to the first spacers, respectively;
    forming a silicide region in the doping region;
    forming a conductive material layer over the silicide region and between the second spacers; and
    removing the first spacers to form the air spacers.

11. The method as claimed in claim 10, wherein the first spacers comprise silicon and the second spacers comprise silicon nitride.

12. The method as claimed in claim 10, wherein the gate structure comprises a gate spacer that comprises a material that is the same as a material of the second spacers and different than a material of the first spacers.

13. The method as claimed in claim 9, wherein the air spacers expose portions of the top surface of the source/drain feature.

14. The method as claimed in claim 9, wherein the doping region has a top width less than a top width of the source/drain feature.

15. The method as claimed in claim 9, wherein the source/drain feature and the doping region have the same conductivity type and wherein the source/drain feature has a doping concentration less than that of the doping region.

16. A method of forming a semiconductor device structure, comprising:
    forming a first gate structure and a second gate structure over a semiconductor substrate and separated from each other by a source/drain region in the semiconductor substrate, wherein the source/drain region has a top width substantially equal to a distance from a first sidewall of the first gate structure to a second sidewall of the second gate structure;

forming a doping region in the source/drain region, wherein the doping region has a top width less than the top width of the source/drain region and is separated from the first sidewall and the second sidewall by a portion of the source/drain region;

forming a silicide region in the doping region, wherein the silicide region has top width less than the top width of the doping region and is laterally separated from the source/drain region by a portion of the doping region;

forming a conductive material layer over the silicide region and between the first sidewall and the second sidewall; and forming a first air spacer between the first sidewall and the conductive material layer, and a second air spacer between the second sidewall and the conductive material layer.

17. The method as claimed in claim 16, further comprising:

forming a first spacer to cover the first sidewall and the portion of the source/drain region and forming a second spacer to cover the second sidewall and the portion of the source/drain region before the formation of the conductive material layer; and removing the first spacer and the second spacer to form the first air spacer and the second air spacer, respectively, after formation of the conductive material layer.

18. The method as claimed in claim 17, further comprising:

implanting ions into the source/drain region before the formation of the first spacer and the second spacer to form the doping region.

19. The method as claimed in claim 17, further comprising:

forming a third spacer to cover the first spacer and the portion of the doping region and forming a fourth spacer to cover the second spacer and the portion of the doping region before the formation of the silicide region.

20. The method as claimed in claim 16, wherein the source/drain region and the doping region have the same conductivity type and wherein the source/drain region has a doping concentration less than that of the doping region.

* * * * *